United States Patent
Lee et al.

(10) Patent No.: US 7,054,199 B2
(45) Date of Patent: May 30, 2006

(54) MULTI LEVEL FLASH MEMORY DEVICE AND PROGRAM METHOD

(75) Inventors: Seung-Keun Lee, Gyeonggi-do (KR); Dong-Ho Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/021,181

(22) Filed: Dec. 22, 2004

(65) Prior Publication Data

US 2005/0190603 A1    Sep. 1, 2005

(30) Foreign Application Priority Data

Feb. 26, 2004    (KR) .................... 10-2004-0012984

(51) Int. Cl.
  G11C 11/34    (2006.01)
  G11C 16/06    (2006.01)
(52) U.S. Cl. ..................... 365/185.22; 365/189.01; 365/185.28
(58) Field of Classification Search ........... 365/185.22, 365/185.28, 189.01; 257/314
  See application file for complete search history.

(56) References Cited

U.S. PATENT DOCUMENTS 5,729,489 A    3/1998    Fazio et al.
6,295,228 B1 *  9/2001    Pawletko et al. ...... 365/185.22
6,643,177 B1 * 11/2003    Le et al. .............. 365/185.2
6,937,520 B1 *  8/2005    Ono et al. ............ 365/185.18

OTHER PUBLICATIONS

Ken Takeuchi, et al. "A Multipage Cell Architecture For High-Speed Programming Multilevel NAND Flash Memories", IEEE Journal of Solid-State Circuit, vol. 33, No. 8, Aug. 1998. pp. 1228-1238.

* cited by examiner

*Primary Examiner*—Richard Elms
*Assistant Examiner*—Eric J. Wendler
(74) *Attorney, Agent, or Firm*—Marger Johnson & McCollom, P.C.

(57) ABSTRACT

We describe a multi level flash memory device and program method. The multi level flash memory device includes a plurality of memory cells, each storing an amount of charge indicative of more than two possible states and control circuitry coupled to the memory cells. The control circuitry to applying a programming voltage alternating with a verification voltage to the memory cells until all are at a desired state and applying at least one additional programming voltage to the cells in a highest state without applying a verification voltage. The method includes applying at least one programming pulse to the cells, verifying that each cell has reached the desired state, selecting the cells that are programmed for a highest state, and applying at least one additional programming pulse to the selected cells without further verifying their state.

24 Claims, 9 Drawing Sheets

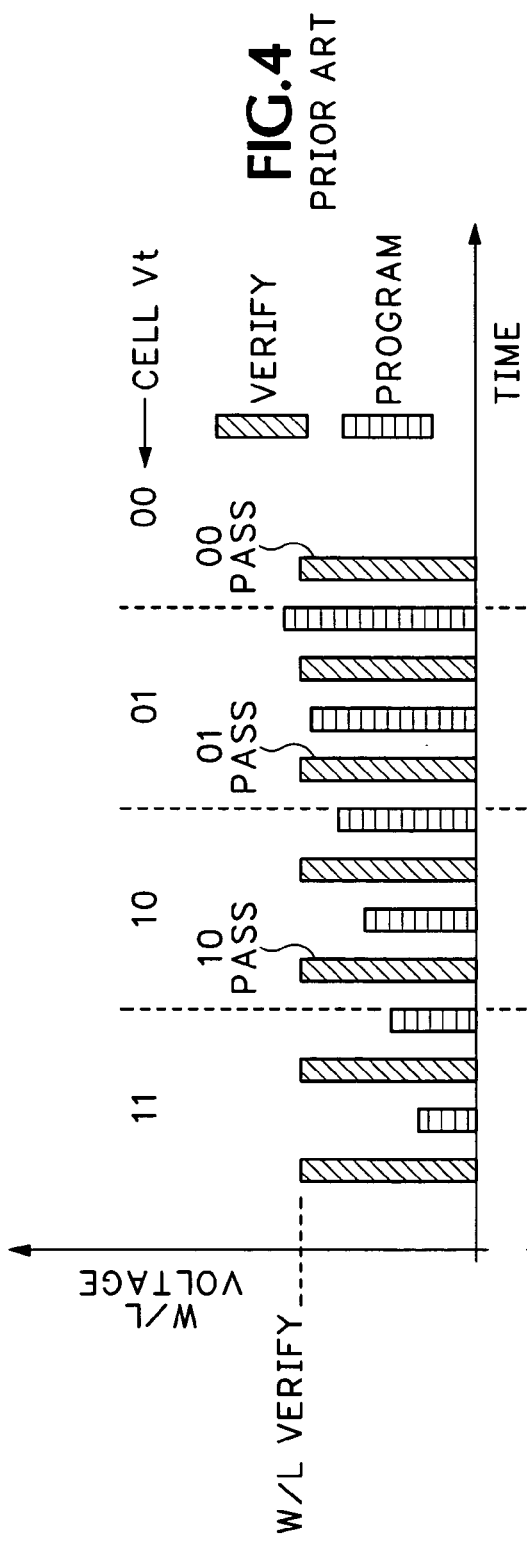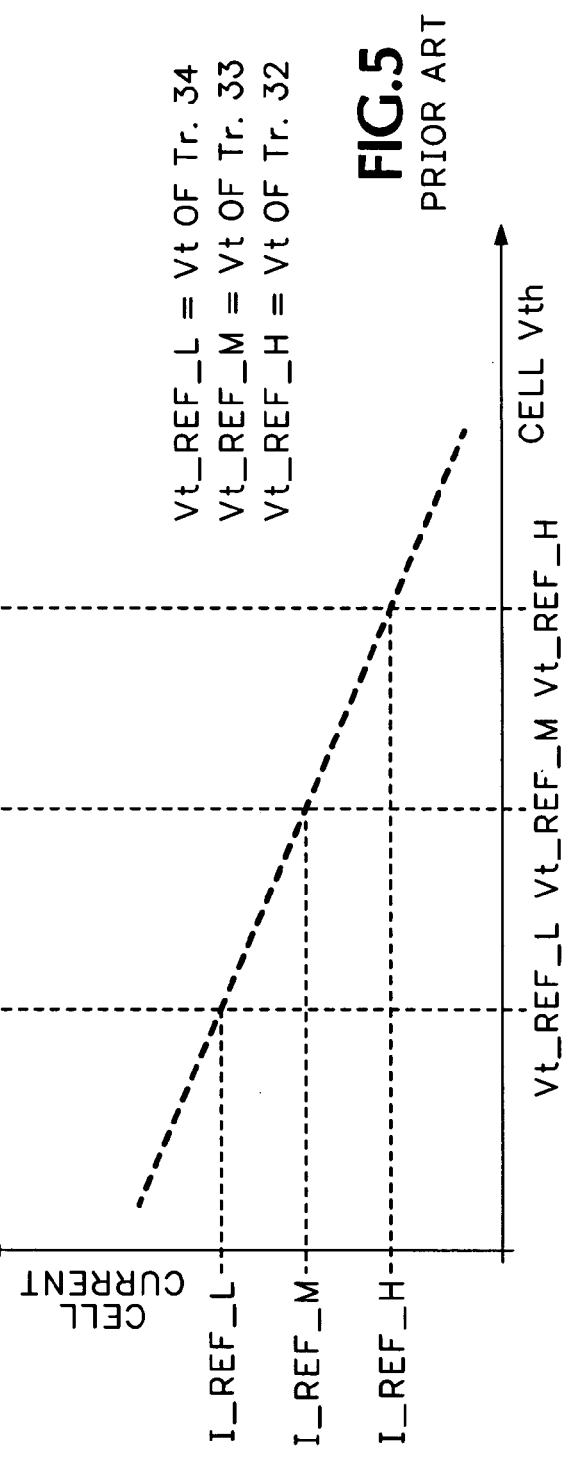

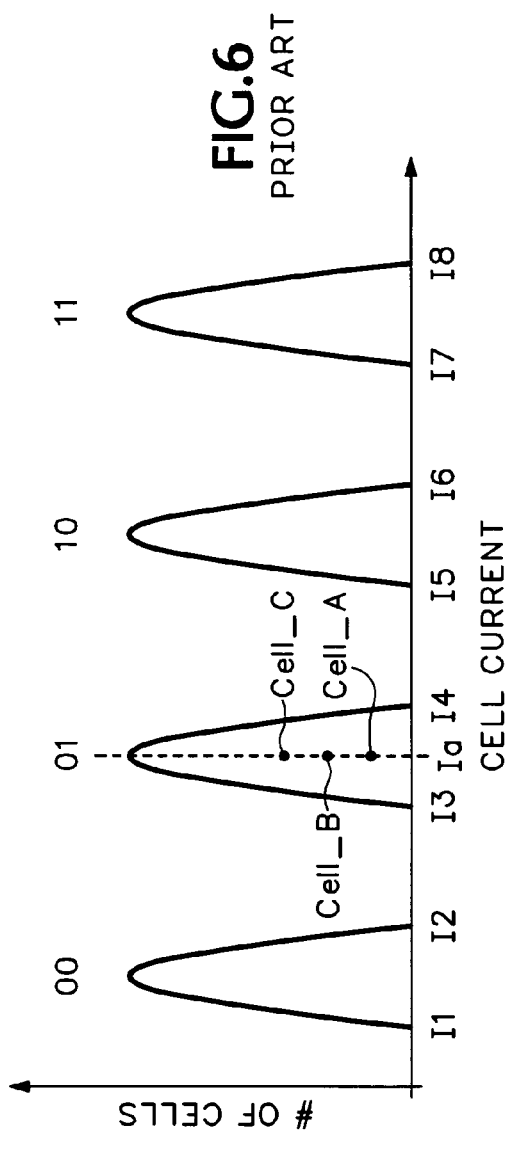
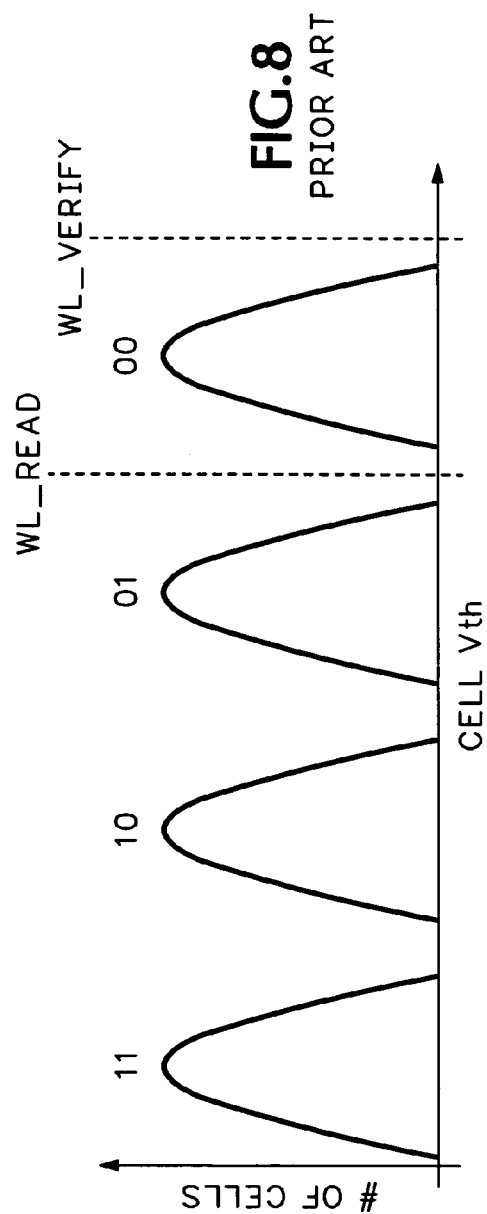

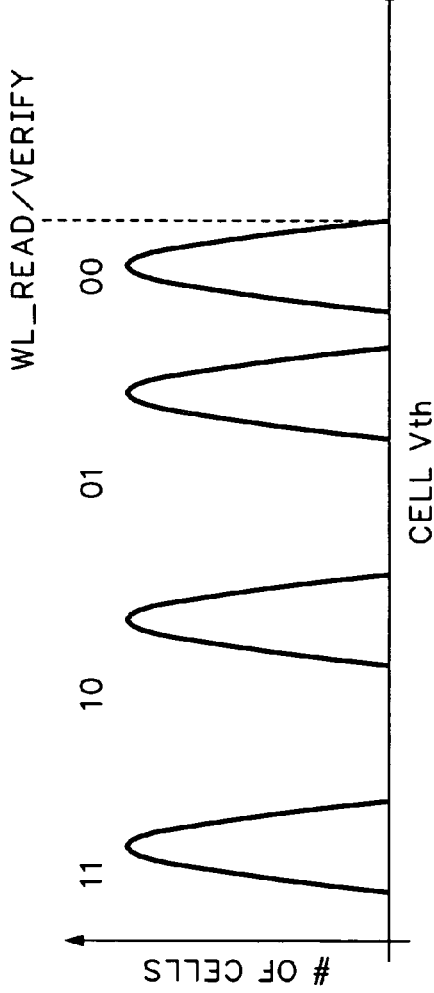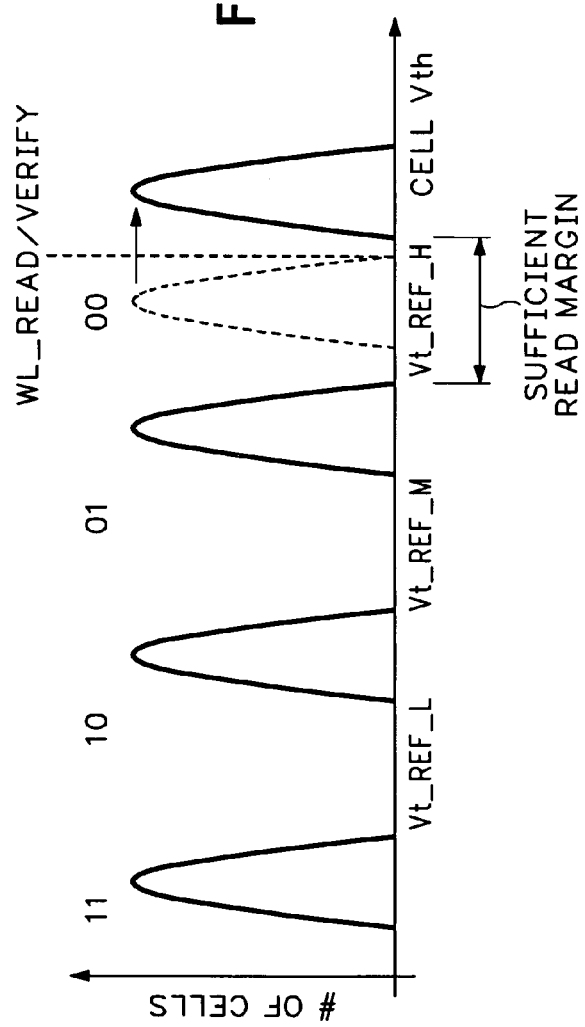

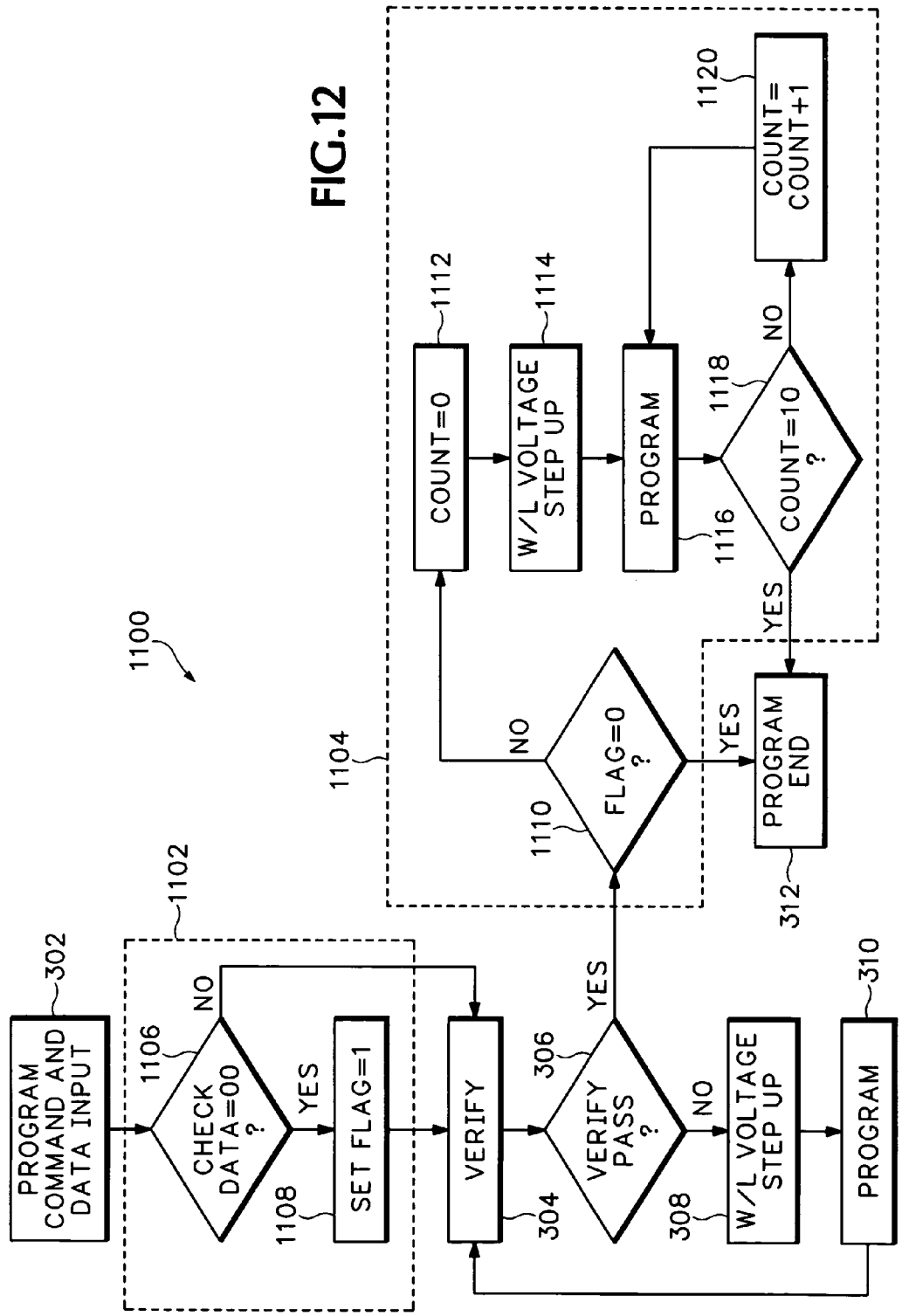

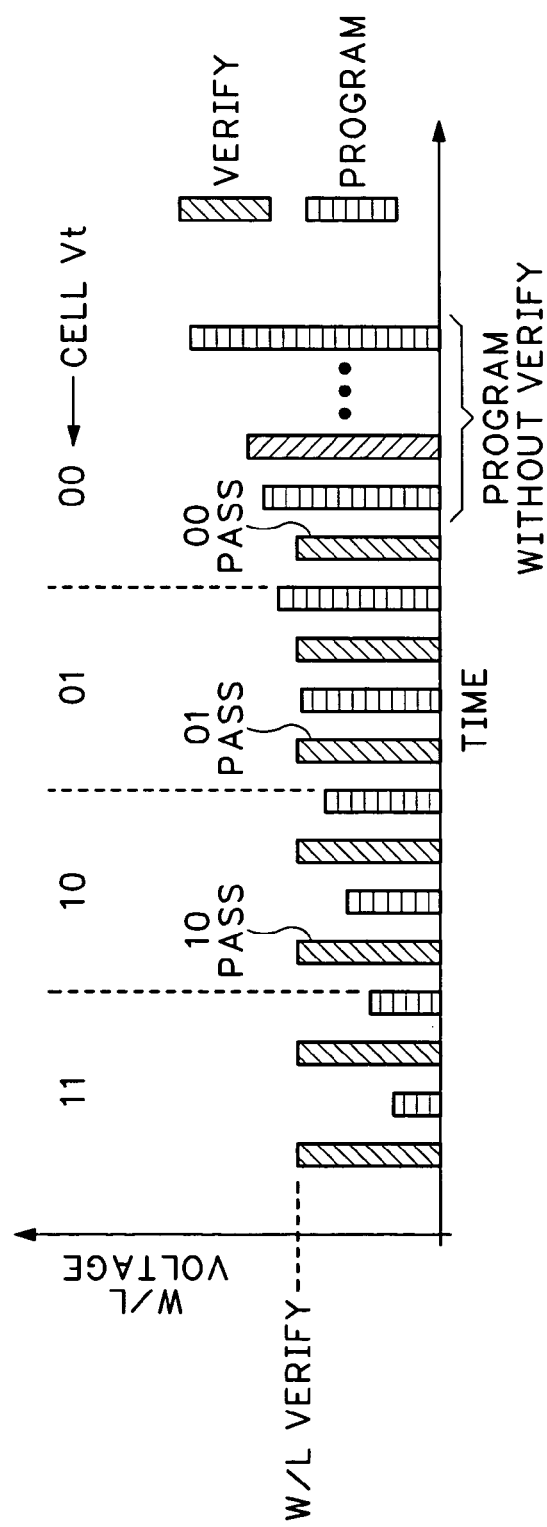

MULTI LEVEL FLASH MEMORY DEVICE AND PROGRAM METHOD

This application claims priority from Korean patent application number P2004-12984 filed Feb. 26, 2004, which we incorporate here by reference.

FIELD

This invention relates to a memory device and program method and, more particularly, to a multi level flash memory device and program method.

BACKGROUND

Modern computer systems often include nonvolatile semiconductor memory devices for data storage. Popular types of nonvolatile semiconductor memory devices are flash memory devices. Referring to FIG. 1, flash memory devices include an array 100 of flash memory cells 10. Each flash memory cell may be, e.g., a field effect transistor (FET). The flash memory cell 10 has a gate 11, a floating gate 21, a source 31, and a drain 41. The gate 11 operates responsive to a word line, e.g., word lines W/L0, W/L1, . . . , W/L1023. The source 31 is coupled to a sense line S/L. The drain 41 operates responsive to corresponding bit lines, e.g., bit lines B/L0, B/L1, . . . , B/L511.

The flash memory cell 10 is programmed, verified, and read by applying varying voltages to the gate 11 through a word line, e.g., W/L0, W/L1, . . . , W/L1023 and comparing the threshold voltage Vt, a drain current Id, and/or the charge stored in the floating gate 21 to a reference memory cell. Programming involves applying a program voltage to the gate 11 to program or store data into the cell array 100 by altering the charge stored in the floating gate 21 that causes a corresponding variation in a threshold voltage Vt, drain current Id, and/or charge stored. Verifying determines successful array 100 programming and typically follows programming. Reading involves reading the data from the programmed cell array 100.

Flash memory cells may store single or multiple data bits. Referring to FIG. 2A, single bit flash memory cells may have a state 1 and a state 0, indicating logic high and low, respectively. The state 1 is a bell curve defined by threshold voltages V1 and V2 where most memory cells programmed to a state 1 will exhibit threshold voltages between V1 and V2. Likewise, the state 0 is a bell curve defined by threshold voltages V3 and V4 where most memory cells programmed to a state 0 will exhibit threshold voltages between V3 and V4. The area between the states 1 and 0 is termed a separation range. A reference voltage Vref typically lies between state 1 and state 0 in the separation range. Separation ranges are theoretically unnecessary but serve to discriminate between states, e.g., states 1 and 0.

Referring to FIG. 2B, unlike single bit memory cells, multiple bit memory cells include a plurality of states, e.g., states 11, 10, 01, and 00. Flash cells that store multiple data bits are desirable because they substantially reduce bit cost. For example, memory cell density may be doubled without an attendant die increase if four data states or levels are implemented on a single cell.

The state 11 is a bell curve defined by threshold voltages V1 and V2 where most memory cells programmed to a state 11 will exhibit threshold voltages between V1 and V2. The state 10 is a bell curve defined by threshold voltages V3 and V4 where most memory cells programmed to a state 10 will exhibit threshold voltages between V3 and V4. The state 01 is a bell curve defined by threshold voltages V5 and V6 where most memory cells programmed to a state 01 will exhibit threshold voltages between V5 and V6. The state 00 is a bell curve defined by threshold voltages V7 and V8 where most memory cells programmed to a state 00 will exhibit threshold voltages between V7 and V8. Separation ranges exist between each state defining reference voltages Vref_low, Vref_medium, and Vref_high. The voltage reference Vref_low is between voltages V2 and V3 of states 11 and 10. The voltage reference Vref_medium is between voltages V4 and V5 of states 10 and 01. And the voltage reference Vref_high is between voltages V6 and V7 of states 01 and 00.

Multi bit memory cells require precise threshold voltage control. The typically higher verify voltage results in relatively narrow state distributions and broad separation ranges at the verify voltage. But when a lower read voltage is thereafter applied, the state distributions broaden and the separation ranges narrow as a result of the varying gm distributions of the storage cells. This increases the likelihood of reading errors, i.e., programming a cell, verifying that it is in the correct state, and thereafter reading it and concluding that it is in a different state.

Accordingly, a need remains for an improved multi level flash memory device and program method.

INVENTION SUMMARY

It is an object of the present invention to overcome the disadvantages associated with prior multi level flash memory devices and program methods.

An embodiment of the invention is a nonvolatile memory device including a plurality of memory cells, each storing an amount of charge indicative of more than two possible states and control circuitry coupled to the memory cells. The control circuitry applies programming pulses alternating with a verification voltage to the memory cells until all are at a desired state. And the control circuitry applies at least one additional programming pulse to the cells in a highest state without applying a verification voltage.

The control circuitry also might apply a read voltage to the cells that is equal to the verification voltage.

The device might include a read margin between the highest cell states and the next highest cell states that is enlarged responsive to the additional programming pulse.

The control circuitry might apply programming pulses alternating with the verification voltage until the control circuitry applies the at least one additional programming pulse.

An alternative embodiment of the invention is a method for programming a plurality of memory cells to a desired state, each cell having more than two possible states. The method includes applying at least one programming pulse to the cells and verifying that each cell has reached the desired state. And the method includes selecting the cells that are programmed for a highest state and applying at least one additional programming pulse to the selected cells without further verifying their state.

The method might include applying a verification voltage to the cell and applying a read voltage that equals the verification voltage to read data from the programmed cells.

The method might include applying at least one additional programming pulse to the selected cells without further verifying their state enlarges a read margin between the highest state and the next highest state.

The method might include applying at least one programming pulse to the cells alternates with verifying that each cell has reached the desired state until applying the additional programming pulse.

BRIEF DRAWINGS DESCRIPTION

The foregoing and other objects, features, and advantages of the invention(s) will become more readily apparent from the detailed description of invention embodiments that references the following drawings.

FIG. 1 is a schematic diagram of a memory cell array 100.

FIGS. 2A–B are memory cell state diagrams for single and multi bit memory cells.

FIG. 4 is a diagram of W/L voltage over time for various verify and program operations associated with the multi bit memory cells shown in FIG. 2B.

FIG. 5 is a diagram of cell current over threshold voltage associated with FIG. 4.

FIG. 6 is memory cell state diagrams for multi bit memory cells.

FIG. 8 are memory cell state diagrams for multi bit memory cells.

FIG. 10 is memory cell state diagrams for multi bit memory cells according to an embodiment of the present invention.

FIG. 11 is memory cell state diagrams for multi bit memory cells according to an embodiment of the present invention.

FIG. 12 is a flowchart of a method according to an embodiment of the present invention.

FIG. 13 is a diagram of W/L voltage over time for various verify and program operations associated with the multi bit memory cells shown in FIG. 10.

DETAILED DESCRIPTION

Figure 1:
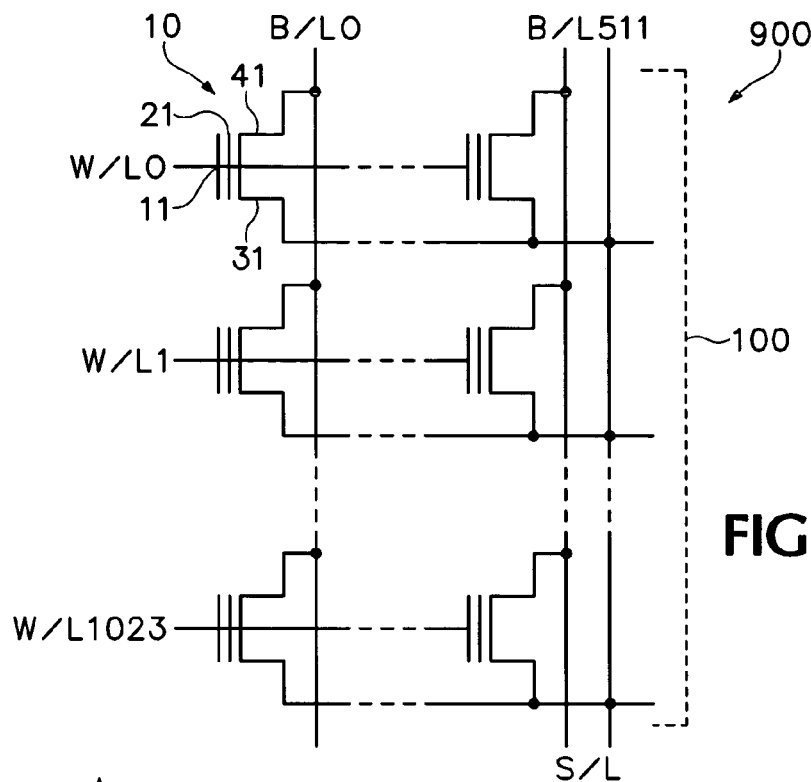
Figure 2A:
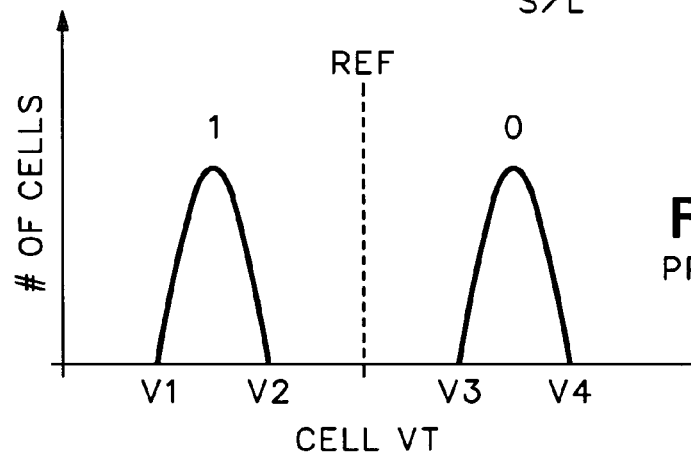
Figure 2B:
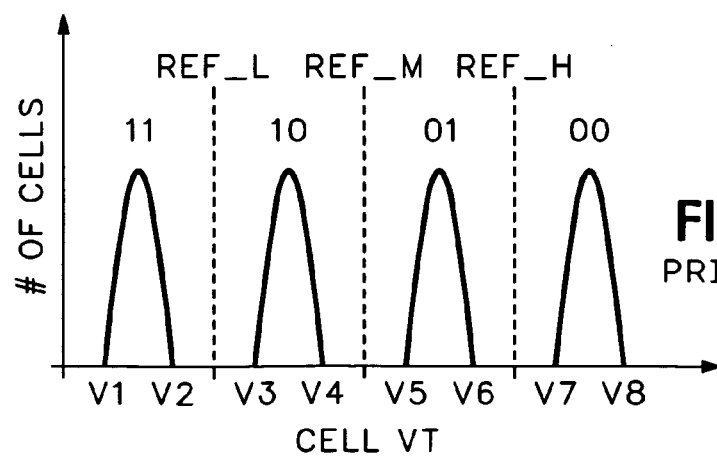
Figure 3:
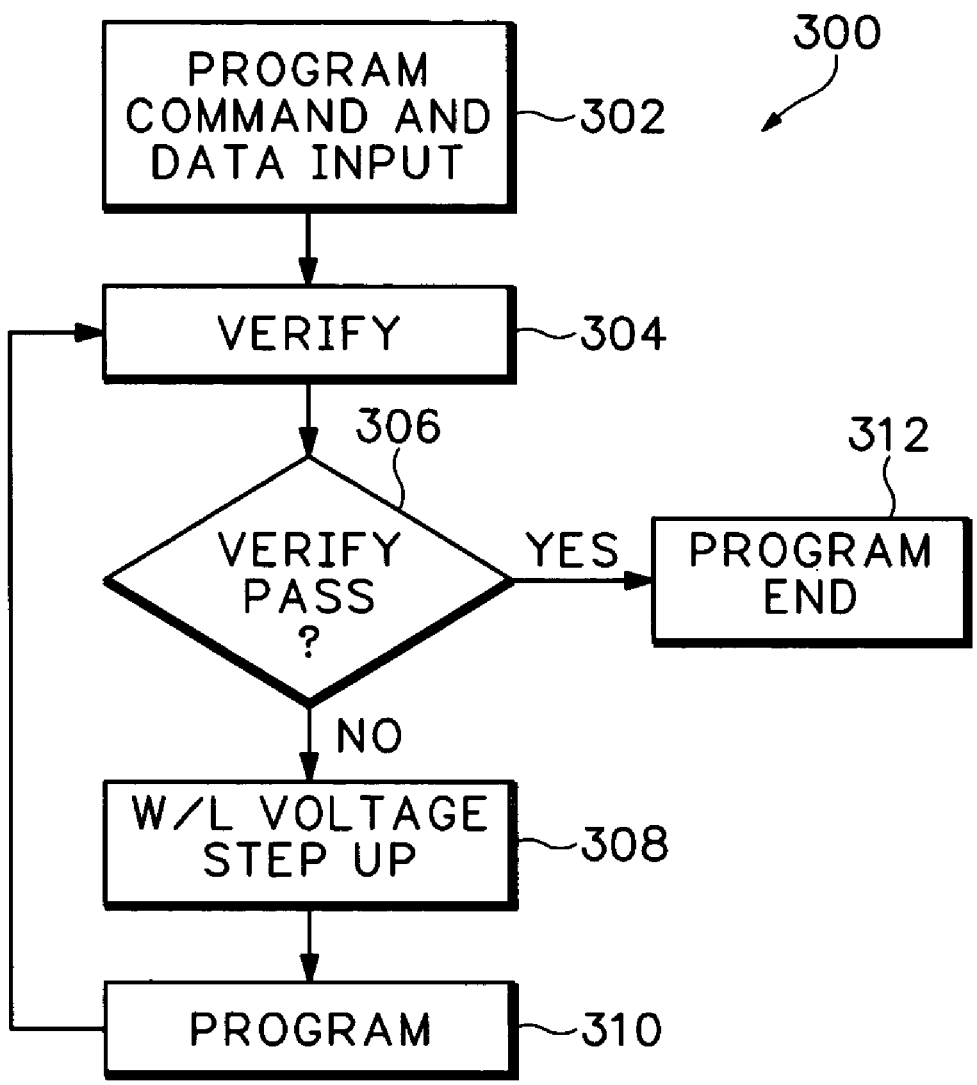
FIG. 3 is a flowchart of a programming method associated with multi bit memory cells.

FIG. 3 is a flowchart of a programming method 300 associated with multi bit memory cells. Referring to FIGS. 1 and 3, the method 300 includes receiving a programming command and data at 302 instructing the memory device to program or store the data into the memory cell array 100. A programming word line voltage W/L is applied to the gate 11 responsive to the programming command that alters the charge stored in the floating gate 21 according to the data. At 304, the method 300 verifies successful programming by applying a fixed verify voltage at the gate 11 and comparing the threshold voltage Vt, a drain current Id, and/or the charge stored in the floating gate 21 to a reference memory cell.

If the verify operation fails at 306, the method 300 steps up the programming word line voltage W/L at 308, receives the programming command and data at 310, and re-verifies proper cell programming at 304. The charge stored in the floating gate 21 increases with each application of a program W/L voltage. That is, the charge stored in the floating gate 21 is proportional to the magnitude, duration and number of applications of a program W/L voltage. The method loops through 304, 306, 308, and 310 until the method 300 ends at 312 after verifying successful device programming. In the method 300, verifying (at 304) follows programming (at 302 and 310).

FIG. 4 is a diagram of W/L voltage over time. Referring to FIGS. 1 and 4, the memory cells 10 are programmed using a program W/L voltage and then verified using a verify W/L voltage. The program W/L voltage increases with the state. That is, the program W/L voltage is lowest when programming the cell 10 to a state 00, and progressively increases to program the cells 10 in states 10, 01, and 00. The verify W/L voltage, on the other hand, remains at a same level to verify states 11, 10, 01, and 00 depending, e.g., on the current through the cell. Note that it is necessary to verify each state, including 00.

FIG. 5 is a diagram of cell or drain current over threshold voltage. Referring to FIGS. 1 and 3–5, the method 300 concurrently programs a plurality of cells by alternately applying a progressively increasing program W/L voltage with a verify W/L voltage to selected cells. As a cell is verified, i.e., that cell programming is confirmed, it is deselected. The verify W/L voltage must be higher than the read voltage because the highest state 00 must be verified. This requires a verify W/L voltage higher than the highest threshold voltage in the 00 state.

The state 00 is read by inference. That is, the state 00 is inferred when the cell is determined (read) as not being in states 00, 01, or 10. The read voltage, therefore, need only go to the highest threshold voltage of the next highest state, i.e., state 01. The read W/L voltage, therefore, is typically lower than the verify W/L voltage.

Figure 7:
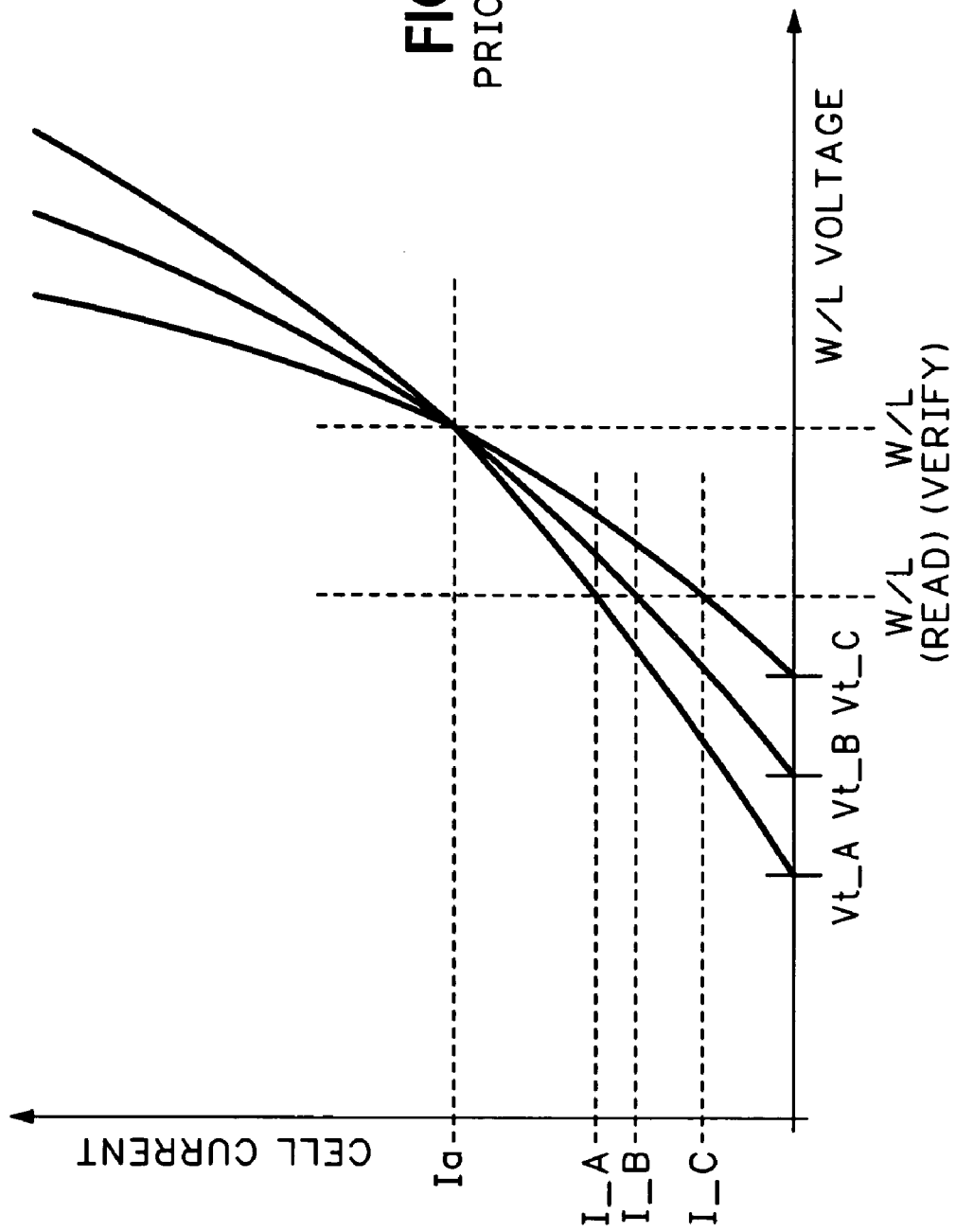
FIG. 7 is a diagram of cell current over threshold voltage associated with FIG. 6.

FIG. 6 is a diagram of state distributions vs. cell current, including three cells A, B, and C all having a cell current Ia. FIG. 7 is a diagram of cell current versus W/L voltages for cells A, B, and C. FIG. 8 is a diagram of state distributions vs. cell threshold voltages. Referring to FIGS. 6–8, different cells, e.g., cells A, B, and C might have identical cell currents Ia for a same verify W/L voltage. But since the read W/L voltage is typically lower than the verify W/L voltage, the read cell currents for cells A, B, and C are lower because of the variation of cell gm distributions. This difference results in widening state voltage ranges and narrowing separation ranges between each state voltage range as shown in FIG. 8. The typically lower read W/L voltage relative to the verify W/L voltage, therefore, decreases read accuracy.

Figure 9:
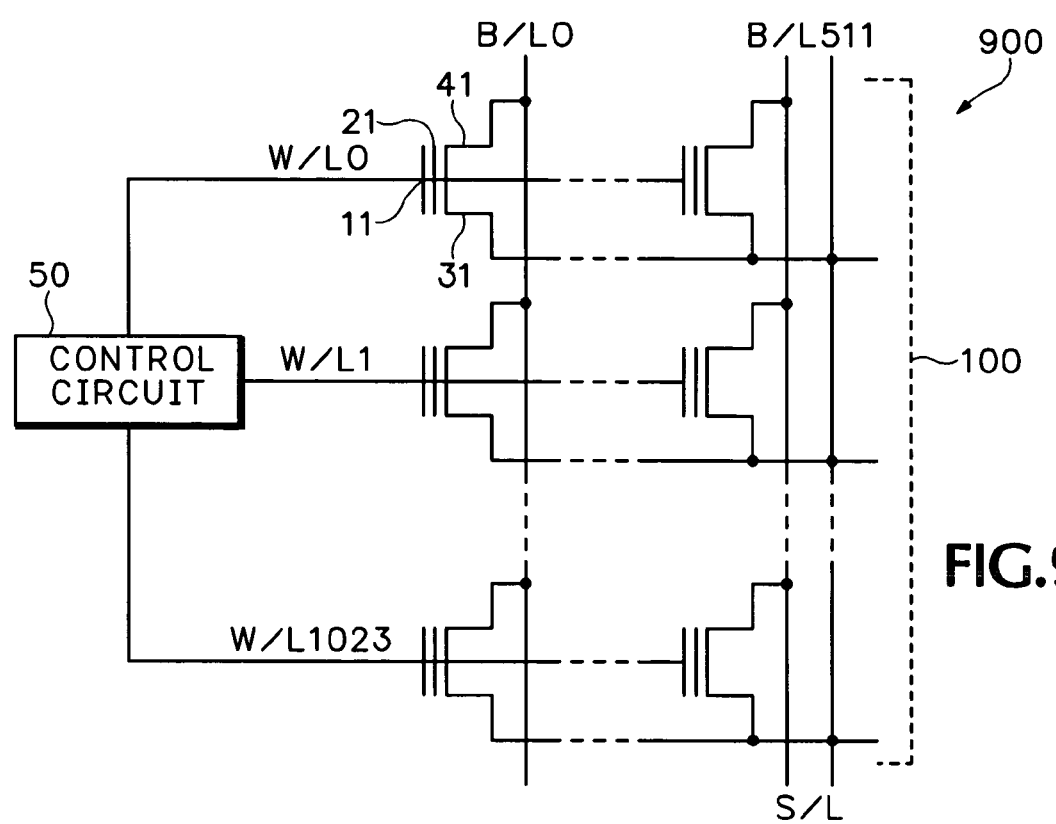
FIG. 9 is a diagram of a multi-level memory device according to an embodiment of the present invention.

FIG. 9 is a diagram of a multi-level memory device according to an embodiment of the present invention. The multi-level memory device 900 includes an array 100 of flash memory cells 10. Each flash memory cell may be, e.g., a field effect transistor (FET). The flash memory cell 10 has a gate 11, a floating gate 21, a source 31, and a drain 41. The source 31 is coupled to a sense line S/L. The drain 41 operates responsive to corresponding bit lines, e.g., bit lines B/L0, B/L1, . . . , B/L511. The gate 11 operates responsive to a word line, e.g., word lines W/L0, W/L1, . . . , W/L1023. The word lines W/L0, W/L1, . . . ,W/L1023 are coupled to a control circuit 50. The control circuit 50 generates and otherwise provides voltage signals or pulses to the word lines W/L0, W/L, . . . , W/L1023 as explained in more detail below. The control circuit 50 may be implemented in software, hardware, or by any means known to a person of reasonable skill in the art.

FIGS. 10 and 11 are diagrams of state voltage ranges according to an embodiment of the present invention. An embodiment of the present invention includes substantially equating the read W/L voltage to the verify W/L voltage as shown in FIGS. 10 and 11. Doing so narrows voltage state ranges and widens separation ranges between states 11 and 01 and between states 10 and 01, improving read accuracy. But because the read and verify voltages are equal, there is very little read voltage margin between states 01 and 00 if nothing further is done, as shown in FIG. 10.

In FIG. 11, the state curves for states 11, 10, 01, and 00 are shown as narrow bell curves with wide separation ranges between corresponding state curves when the read and verify W/L voltages are substantially the same. This is in contrast to the same state curves shown in FIG. 8 in which different read and verify W/L voltages result in wider state curves with narrower separation ranges between corresponding state curves, decreasing read accuracy.

But equating read and verify W/L voltages may decrease the read voltage margin between states 01 and 00, as shown in FIG. 10, since the read/verify W/L is just above the threshold voltage required to turn on transistors in state 00. Recall that state 00 is read by inference. That is, state 00 is inferred when the cell is read as not being in states 11, 10, or 01 (and thus detecting no current flow in associated cells).

To improve the read voltage margin between states 01 and 00 while maintaining equal the read and verify W/L voltages, an embodiment of the present invention includes programming memory cells without intervening verify operations as explained below with reference to FIG. 12. Doing so proportionally increases the charge stored in the storage gate 21 without an intervening verify operation. Increasing the charge stored in the storage gate 21 shifts the state 00 curve to the right of the read/verify W/L voltage as shown in FIG. 11, increasing the read margin while improving read accuracy with equal verify and read W/L voltages.

FIG. 12 is a flowchart of a method according to the present invention. Referring to FIG. 12, a method 1100 includes the method 300 (FIG. 3) modified by flag setting and loop routines 1102 and 1104. After programming at 302, the method 1100 executes flag setting routine 1102. The method determines whether the memory cell includes data in state 00 (1106). If the cell is in state 00, the method 1100 sets a flag at 1108. If the method 1100 verifies cell programming at 306, it executes loop routine 1104. The method 1100 checks whether the flag is set to 1 at 1110. If it is, the method 1100 ends at 312. If the flag is not set at 1110 (e.g., because the cell is not programmed at state 00), it sets a counter to zero at 1112. The method 1100 steps up the W/L voltage at 1114, programs the cell at 1116, and increases the count by one at 1120 until the count reaches a predetermined (and perhaps programmable) limit, e.g., 10 (1118). Once the count reaches a predetermined limit at 1118, the program ends at 312. By executing loop routine 1104, the method 1100 effectively shifts the state 00 voltage range right as shown in FIG. 11 and explained above.

FIG. 13 is a diagram of W/L voltage over time. Referring to FIG. 13, the method 1100 includes a loop routine 1104 that programs the cell at 1116, and increases the count by one at 1120 until the count reaches a predetermined (and perhaps programmable) limit, e.g., 10 (1128). Once the count reaches a predetermined limit at 1118, the program ends at 312.

Having illustrated and described the principles of our invention, it should be readily apparent to those skilled in the art that the invention may be modified in arrangement and detail without departing from such principles. We claim all modifications coming within the spirit and scope of the accompanying claims.

We claim:

1. A method for programming a plurality of memory cells to a desired state, each cell having more than two possible states, comprising:
   applying at least one programming pulse to the cells;
   verifying that each cell has reached the desired state;
   selecting the cells that are programmed for a highest state; and
   applying at least one additional programming pulse to the selected cells without further verifying their state.

2. The method of claim 1 where verifying that each cell has reached the desired state comprises:
   applying a verification voltage to the cell; and
   applying a read voltage that equals the verification voltage to read data from the programmed cells.

3. The method of claim 1 where applying at least one additional programming pulse to the selected cells without further verifying their state enlarges a read margin between the highest state and the next highest state.

4. The method of claim 1 where applying at least one programming pulse to the cells alternates with verifying that each cell has reached the desired state until applying the additional programming pulse.

5. A method of operating a memory device having a plurality of memory cells, each memory cell having more than two possible states, comprising:
   programming the cells to a desired state;
   applying a selected voltage to verify that the cells are in the desired state;
   programming the cells in a highest state to a higher level; and
   applying the selected voltage to read data from the cells.

6. The method of claim 5 where programming the cells in the highest state to a higher level enlarges the read margin between the highest state and the higher level.

7. The method of claim 5 where programming the cells to a desired state alternates with applying the selected voltage to verify that the cells are in the desired state until the cells in the highest state are programmed to the higher level.

8. The method of claim 5 comprising applying at least one additional selected voltage to the cells without further verifying their state to enlarge a read margin between the highest state and the higher level.

9. A method of enlarging the read margin between states in a plurality of memory cells, each memory cell having more than two possible states, comprising:
   applying programming pulses to the cells;
   verifying that each cell has reached a desired state; and
   applying at least one additional programming pulse to the cells in a highest state without any further verification of the state of those cells.

10. The method of claim 9 where verifying that each cell has reached the desired state comprises:
    applying a verification voltage to the cell; and
    reading data from the programmed cells by applying a read voltage that equals the verification voltage.

11. The method of claim 9 where applying at least one additional programming pulse to the cells in the highest state without any further verification of the state of those cells enlarges a read margin between the states.

12. The method of claim 9 where applying programming pulses to the cells alternates with verifying that each cell has reached the desired state until the additional programming pulse is applied.

13. A nonvolatile memory device comprising:
    a plurality of memory cells, each storing an amount of charge indicative of more than two possible states; and
    control circuitry coupled to the memory cells, the control circuitry to apply programming pulses alternating with a verification voltage to the memory cells until all are at a desired state and to apply at least one additional programming pulse to the cells in a highest state without applying a verification voltage.

14. The nonvolatile memory device of claim 13 where the control circuitry applies a read voltage to the cells that is equal to the verification voltage.

15. The nonvolatile memory device of claim 13 where the device includes a read margin between the highest cell states and the next highest cell states that is enlarged responsive to the additional programming pulse.

16. The nonvolatile memory device of claim 13 where the control circuitry applies programming pulses alternating with the verification voltage until the control circuitry applies the at least one additional programming pulse.

17. A nonvolatile memory device comprising:
 means for applying at least one programming pulse to the cells;
 means for verifying that each cell has reached the desired state;
 means for selecting the cells that are programmed for a highest state; and
 means for applying at least one additional programming pulse to the selected cells without further verifying their state.

18. The nonvolatile memory device of claim 17 where the means for verifying that each cell has reached the desired state comprises:
 means for applying a verification-voltage to the cell; and
 means for applying a read voltage that equals the verification voltage to read data from the programmed cells.

19. The nonvolatile memory device of claim 17 where the means for applying at least one additional programming pulse to the selected cells without further verifying their state includes means for enlarging a read margin between the highest state and the next highest state.

20. The nonvolatile memory device of claim 17 where the means for applying at least one programming pulse to the cells alternates with the means for verifying that each cell has reached the desired state until the means for applying the additional programming pulse applies the additional programming pulse.

21. A nonvolatile memory device comprising:
 memory cell means, each cell storing an amount of charge indicative of more than two possible states; and
 control means coupled to the memory cell means, the control means to apply programming pulses alternating with a verification voltage to the memory cell means until all are at a desired state and to apply at least one additional programming pulse to the memory cell means in a highest state without applying a verification voltage.

22. The nonvolatile memory device of claim 21 where the control means applies a read voltage to the memory cell means that is equal to the verification voltage.

23. The nonvolatile memory device of claim 21 where the device includes a read margin means between the highest cell states and the next highest cell states that is enlarged responsive to the additional programming pulse.

24. The nonvolatile memory device of claim 21 where the control means applies programming pulses alternating with the verification voltage until the control means applies the at least one additional programming pulse.

\* \* \* \* \*